United States Patent
Zhou et al.

(10) Patent No.: US 7,095,277 B2
(45) Date of Patent: Aug. 22, 2006

(54) METHOD AND ARRANGEMENT FOR A POWER AMPLIFIER

(75) Inventors: Shu-Ang Zhou, Älvsjö (SE); Michael Faulkner, Melbourne (AU)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 130 days.

(21) Appl. No.: 10/492,524

(22) PCT Filed: Sep. 19, 2002

(86) PCT No.: PCT/SE02/01694

§ 371 (c)(1),
(2), (4) Date: Apr. 14, 2004

(87) PCT Pub. No.: WO03/034585

PCT Pub. Date: Apr. 24, 2003

(65) Prior Publication Data

US 2004/0196899 A1    Oct. 7, 2004

(30) Foreign Application Priority Data

Oct. 15, 2001 (SE) .................................... 0103412

(51) Int. Cl.
*H03F 1/26* (2006.01)
(52) U.S. Cl. ...................... 330/149; 330/151
(58) Field of Classification Search .................... 330/2, 330/302–306, 124–126, 149; 455/63, 115, 455/126
See application file for complete search history.

(56) References Cited

U.S. PATENT DOCUMENTS

| | | | | |
|---|---|---|---|---|
| 5,559,468 A | * | 9/1996 | Gailus et al. | 330/110 |
| 5,642,358 A | * | 6/1997 | Dent | 370/323 |
| 5,862,181 A | * | 1/1999 | Ishizuka | 375/259 |
| 5,903,823 A | * | 5/1999 | Moriyama et al. | 455/126 |
| 6,054,896 A | * | 4/2000 | Wright et al. | 330/149 |
| 6,091,941 A | * | 7/2000 | Moriyama et al. | 455/126 |
| 6,313,703 B1 | * | 11/2001 | Wright et al. | 330/149 |
| 6,864,745 B1 | * | 3/2005 | Ode et al. | 330/149 |
| 2003/0058956 A1 | * | 3/2003 | Rosnell et al. | 375/295 |

FOREIGN PATENT DOCUMENTS

| | | |
|---|---|---|
| EP | 0 928 062 A1 | 7/1999 |
| WO | 93/18590 A1 | 9/1993 |
| WO | 00/19600 A1 | 4/2000 |

OTHER PUBLICATIONS

Patent Abstracts of Japan, vol. 2000, No. 19, Jun. 5, 2001 & JP 2001 053627 A (Matsushita Electric Ind Co Ltd) Feb. 23, 2001.

* cited by examiner

*Primary Examiner*—Linh Van Nguyen
(74) *Attorney, Agent, or Firm*—Nixon & Vanderhye, P.C.

(57) ABSTRACT

The present invention relates to an arrangement and a method for amplifying high frequency RF signals having amplitude and phase variations. The objective problem of the present invention is to provide an efficient power amplifier for amplifying high frequency RF signals. The object is achieved by introducing a Signal Conditioning Device (SCD) that converts baseband signals SI and SQ into tri-states signals STI, STQ. The tri-states signals STI, STQ are time multiplexed, which results in that a single power amplifier can be used to amplify the signal on the In-phase (I) channel and the signal on the Quadrature (Q) channel. Hence, the present invention does not require a power combiner.

18 Claims, 9 Drawing Sheets

METHOD AND ARRANGEMENT FOR A POWER AMPLIFIER

This application is the US national phase of international application PCT/SE02/01694 filed in English on 19 Sep. 2002, which designated the US. PCT/SE02/01694 claims priority to SE Application No. 0103412-3 filed 15 Oct. 2001. The entire contents of these applications are incorporated herein by reference.

FIELD OF INVENTION

The present invention relates to a power amplifier. In particular, it relates to a high efficient Non Linear Power Amplifier (NLPA) for amplifying high frequency Radio Frequency (RF) signals with varying phase and amplitude.

BACKGROUND OF THE INVENTION

High efficient Radio Frequency (RF) power amplifiers are critical components in modern radio communications systems. With worldwide increasing use of radio communications means, the energy consumption of very large number of radio base stations deployed becomes significant, which not only increases the cost for radio network operators, but also causes environment problems.

During the past, numbers of highly efficient power amplifiers have been proposed in literature. In particular, the switching mode power amplifier, such as class D, class E, class S, etc., have received the increasing attention for their possible applications in both radio receivers and radio base stations due to their very high efficiency. However, these types of switching-mode power amplifiers are highly non-linear. Special circuit architecture, such as, LInear amplification using Non-linear Components (LINC) technique, are usually required for their use in highly linear RF power amplifier applications. Although recent ideas of applying digitally, sigma-delta, modulated signals directly to switching-mode power amplifiers are promising. The operating frequency of these switching mode power amplifiers is, however, so far limited and not ready to be used in current radio transmitters with GHz carrier wave frequencies. The problem is that the high efficiency of these power amplifiers cannot be maintained due to the upper frequency limit of available RF power transistors and their intrinsic Ohmic losses with the current semiconductor technology.

In U.S. Pat. No. 3,896,395 two NLPAs 104,106 are used to amplify constant envelope RF signals directly after the mixers 108, 110 for both the I and Q branches, as shown in FIG. 1. The I and Q baseband signals $S_I$, $S_Q$ are converted into a bi-state (+1, −1) pulse train using a delta coder 112, 114. This will generate a constant envelope PSK modulated RF signal alter mixing with the Local Oscillator (LO) 116. However, a high level RF power combiner 102 used in the approach shown in this document may cause power lass (e.g., 3 dB loss), which win significantly reduce the total power efficiency of the linear amplification by Sampling Technique (LIST) as described in the document.

A drawback with the power amplifier disclosed U.S. Pat. No. 3,896,395, is that the power combiner 102 causes power loss as described above and hence degrade the efficiency.

SUMMARY

An objective of the present invention is to provide a power efficient power amplifier device by using a high efficient non linear power amplifier for amplifying a high frequency RF signal with phase and amplitude variations.

The power amplifier device provided by the present invention, comprising a Signal Conditioning Device (SCD), comprising means for generating an n-state level I component signal $S_{II}$ from said I component signal $S_I$, means for generating an n-state level Q component signal $S_{TQ}$ from said Q component signal $S_Q$, and means for interleaving the n-state level I component signal and the n-state level Q component signal into, a non-overlapping in time, I component signal $S_{II}$ and Q component signal $S_{TQ}$, a multiplexing device 204, comprising means for generating a signal $S_{MIQ}$ with a high frequency carrier wave wherein the I and Q components are being time multiplexed; and a single Power Amplifier (PA) 206 comprising means for amplifying said signal $S_{MIQ}$, makes it possible to amplify a high frequency RF signal with phase and amplitude variations in a power efficient way.

The method carried out by power amplifier device provided by the present invention comprising the steps of:

generating an n-state level I component signal from an I component signal $S_I$, generating an n-state level Q component signal from a Q component signal $S_Q$, interleaving the n-state level I component signal and the n-state level Q component signal into, a non-overlapping in time, I component signal $S_{II}$ and Q component signal $S_{TQ}$;

generating a signal $S_{MIQ}$ with a high frequency carrier wave wherein the I and Q components are being time multiplexed and amplifying said signal $S_{MIQ}$ using a single Power Amplifier PA 206, makes it possible to amplify a high frequency RF signal with phase and amplitude variations in a power efficient way.

An advantage with the present invention is that heatsinks, required by the output transistors in the amplifier, is smaller and thereby cheaper and more reliable (thanks to less thermal problems) in a high efficiency non-linear amplifiers.

DETAILED DESCRIPTION OF THE INVENTION

The present invention amplifies a high frequency signal in a power efficient manner by using a high efficient power amplifier, which generally is non-linear, and by eliminating a power combiner 102 which causes power loss.

Figure 2:
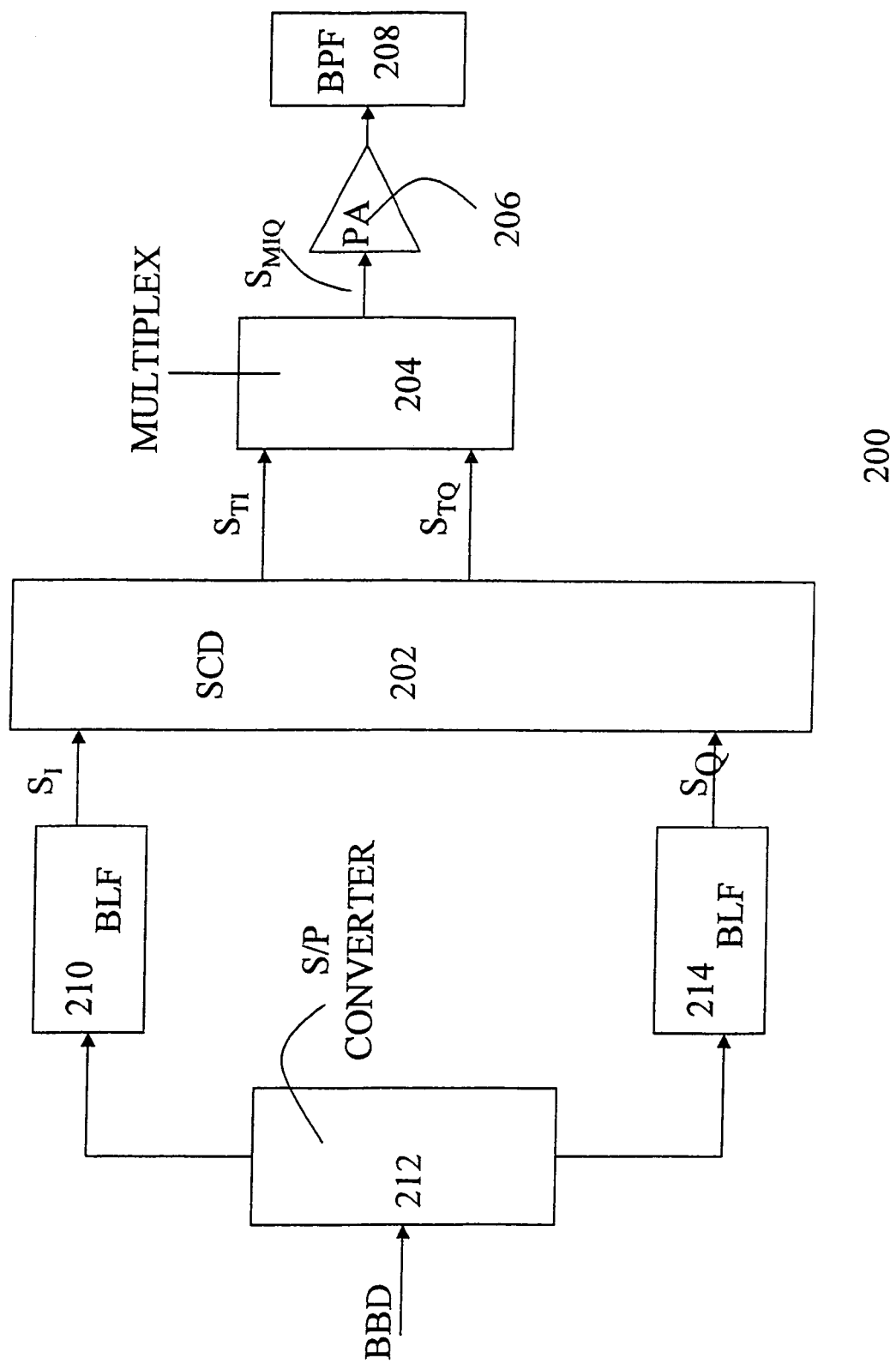
FIG. 2 discloses a circuit diagram of an example embodiment in a general mode.

A general mode of an example embodiment is shown in FIG. 2. An amplification device 200 comprises a Serial to Parallel (S/P) converter 212 connected to two Band Limit Filters (BLF) 210, 214. Each of the BLFs 210, 214 is respectively connected to a Signal Conditioning Device (SCD) 202. The SCD is further connected to a multiplexing device 204 and the multiplexing device is further connected to a high efficient Power Amplifier (PA) 206 that is connected to a Band Pass Filter (BPF) 208.

The S/P Converter 212 converts a Base Band Data (BBD) signal into two parallel datastreams, into an In-phase (I) respective a Quadrature (Q) component Each of the Band Limit Filters (BLF) 210, 214 averages the short bursts of different phase carriers into a continuous signal of an appropriate amplitude and phase. The output from the respective BLF 210, 214 is thus a respective baseband signal, $S_I$ and $S_Q$. There are however, many alternative ways in which the baseband $S_I$ and $S_Q$ signals can be generated for single carrier and multicarrier systems.

Figure 1:
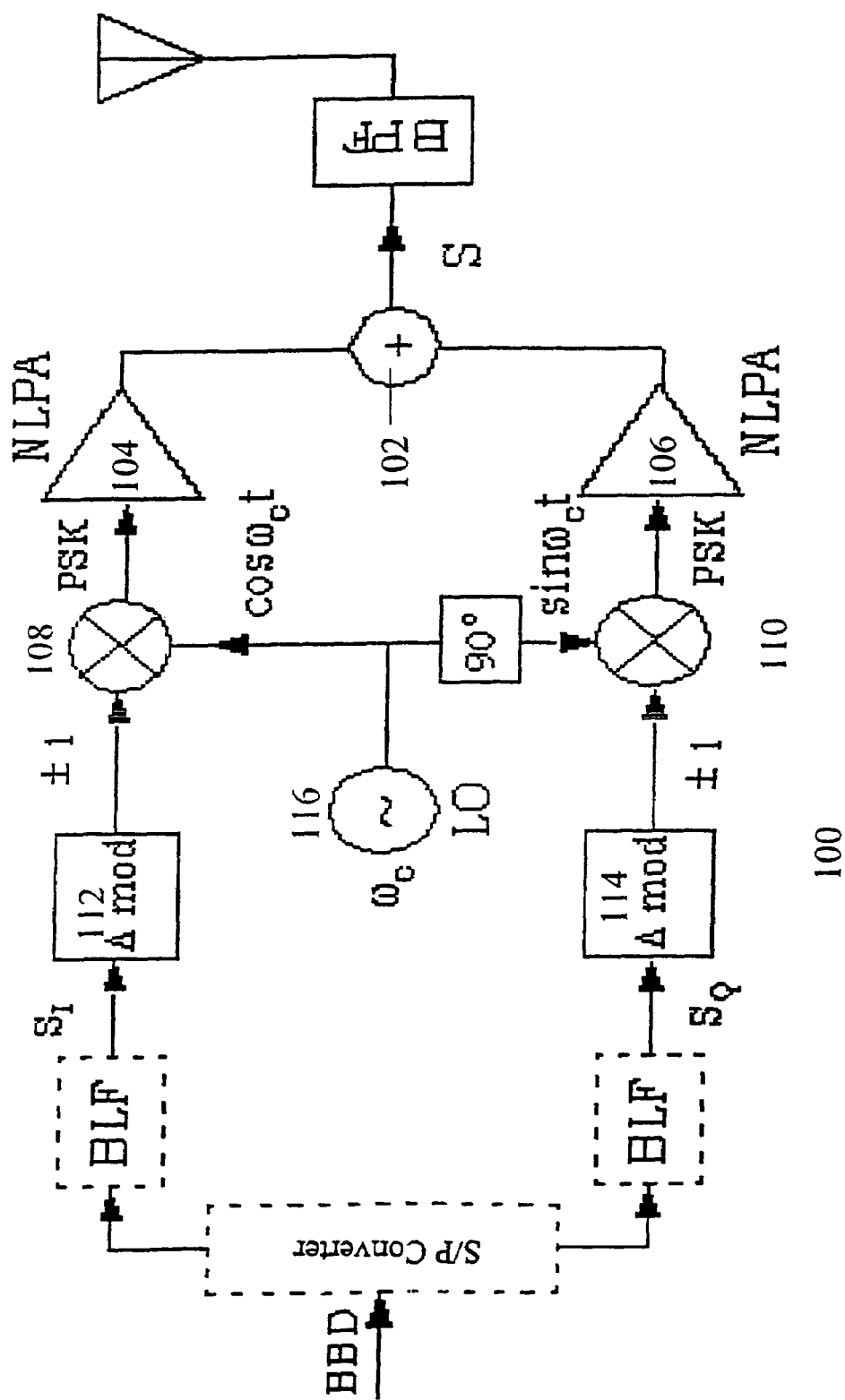
FIG. 1 shows a circuit diagram of an example of prior art.
Figure 4:
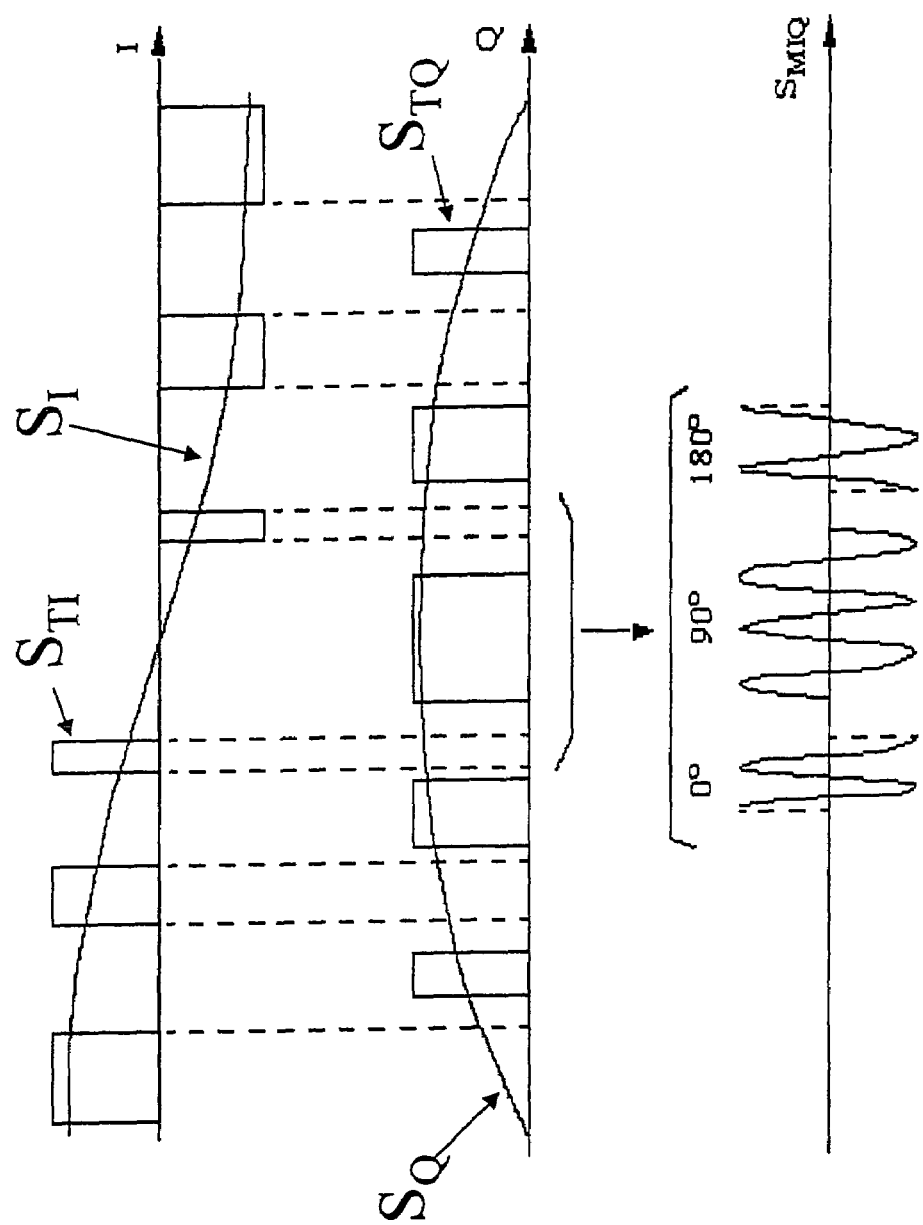
FIG. 4 shows a scheme of a Pulse-Width Modulated (PWM) signal according to an example embodiment.

In the present invention, the use of the RF power combiner 102, used in the U.S. Pat. No. 3,896,395, is eliminated. By the introduction of the SCD 202 the baseband signals $S_I$, $S_Q$ are converted into interleaved tri-state (−1, 0, +1) (or another odd number of states) signals, as shown in FIG. 4. Only one Non-linear Power Amplifier (NLPA) in FIG. 1 is active at any given time, so the combiner 102 can be replaced by the multiplexing device 204, and thereby eliminating the power loss. Since $S_I$ is only in the active state (+1,−1 or non null (0) state) when $S_Q$ is in the null state (0) and visa versa, it is possible to replace the two NLPA's 104 and 106 in FIG. 1 by a single power amplifier 206 as shown in FIG. 2.

Signal Conditioning Device (SCD)

The SCD 202 generates in-time, non-overlapping switching signals $S_{TI}$, $S_{TQ}$ with a e.g. three-, or another odd number referred to as n, level state output.

Multiplexing Device

The multiplexing device 204 uses the $S_{TI}$ and $S_{TQ}$ control signals to time multiplex different components of the local oscillator signal (normally the I and Q components) into one signal $S_{MIQ}$ so that a single amplifier can be used for both of the components. This is used instead of having a separate amplifier for the I and for the Q channel.

The power amplifier 206 is a highly efficient power amplifier, which generally is non-linear, and it amplifies the signal $S_{MIQ}$. The purpose of the BPF 208 is e.g. to only permit signal bands of interest to pass and cut off all quantization noises generated by the SCD. The output signals after the BPF will then be the desired bandwidth-limited signals with both amplitude and phase modulations.

Figure 3:
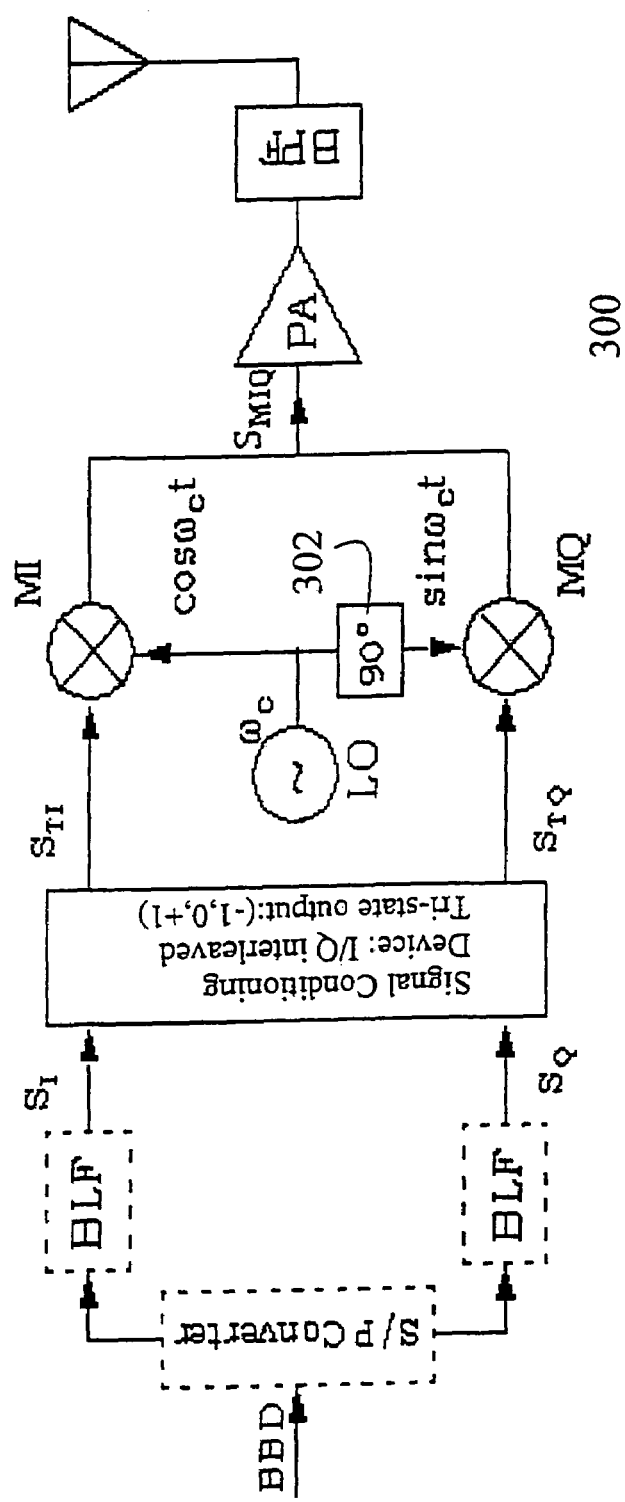
FIG. 3 depicts a scheme of a RF power amplifier correlated with digital modulation according to an example embodiment.

In FIG. 3, a first embodiment of the present invention is shown. The multiplexing device is implemented by means of multiplier devices MI and MQ, a phase shifter 302 and a Local Oscillator (LO). The LO generates the carrier wave with the frequency $\omega_c$ and the phase shifter shifts the phase of the carrier wave 90 degrees. Here, the output signals $S_{MIQ}$ from the devices MI and MQ, which are controlled by $S_{TI}$ and $S_{TQ}$ respectively, will not overlap in time with each other, since the two multiplier devices MI and MQ are never enabled at the same time. If $S_{TI}$ is separated from zero then $S_{TQ}$ is always zero and visa-versa. Thus, the RF signal $S_{MIQ}$ from the devices MI and MQ, may be a high-power RF signal and a Pulse-Width Modulated (PWM) signal, as shown in FIG. 4.

Pulse-Width Modulated Signal

FIG. 4 shows the PWM signals $S_{TI}$ (on the I-axis) and $S_{TQ}$ (on the Q-axis). The $S_{TI}$ and $S_{TQ}$ PWM signals have the states of +1, 0, −1 (n=3).

$S_{TI}=+1$:

When the $S_{TI}$ channel is in +1 state, then an RF carrier is enabled (multiplied by +1) and therefore has 0 degree phase, see the multiplier device in FIG. 3.

$S_{TI}=-1$

When $S_{TI}$ is in the state of −1 the RF carrier is multiplied by −1 and has therefore a phase shift of 180 degrees.

$S_{TI}=0$

When $S_{TI}$ is in the 0 state then the RF carrier is multiplied by 0, i.e. nothing comes out from the multiplier.

$S_{TQ}=+1$

When the $S_{TQ}$ channel is in +1 state, then a 90 degree phase shifted RF carrier is enabled (multiplied by +1) and therefore has 90 degree phase, see the multiplier device in FIG. 3.

$S_{TQ}=-1$

When $S_{TQ}$ is in the state of −1 the 90 degree phase shifted RF carrier is multiplied by −1 and has therefore a phase shift of 90−180=−90 degrees.

$S_{TQ}=0$

When in the 0 state then the 90 degree phase shifted RF carrier is multiplied by 0 i.e. nothing comes out from the multiplier.

Thus, highly efficient nonlinear power amplifiers, such as class C, D, E or S, can be used to amplify these signals, since the signals have constant envelopes. The SCD 202 may use noise shaping techniques to improve performance by shifting quantisation noise away from the desired signal spectrum. An example of such a noise shaping technique is the "sigma delta" or "delta sigma" method used in analogue to digital converters.

Figure 5:
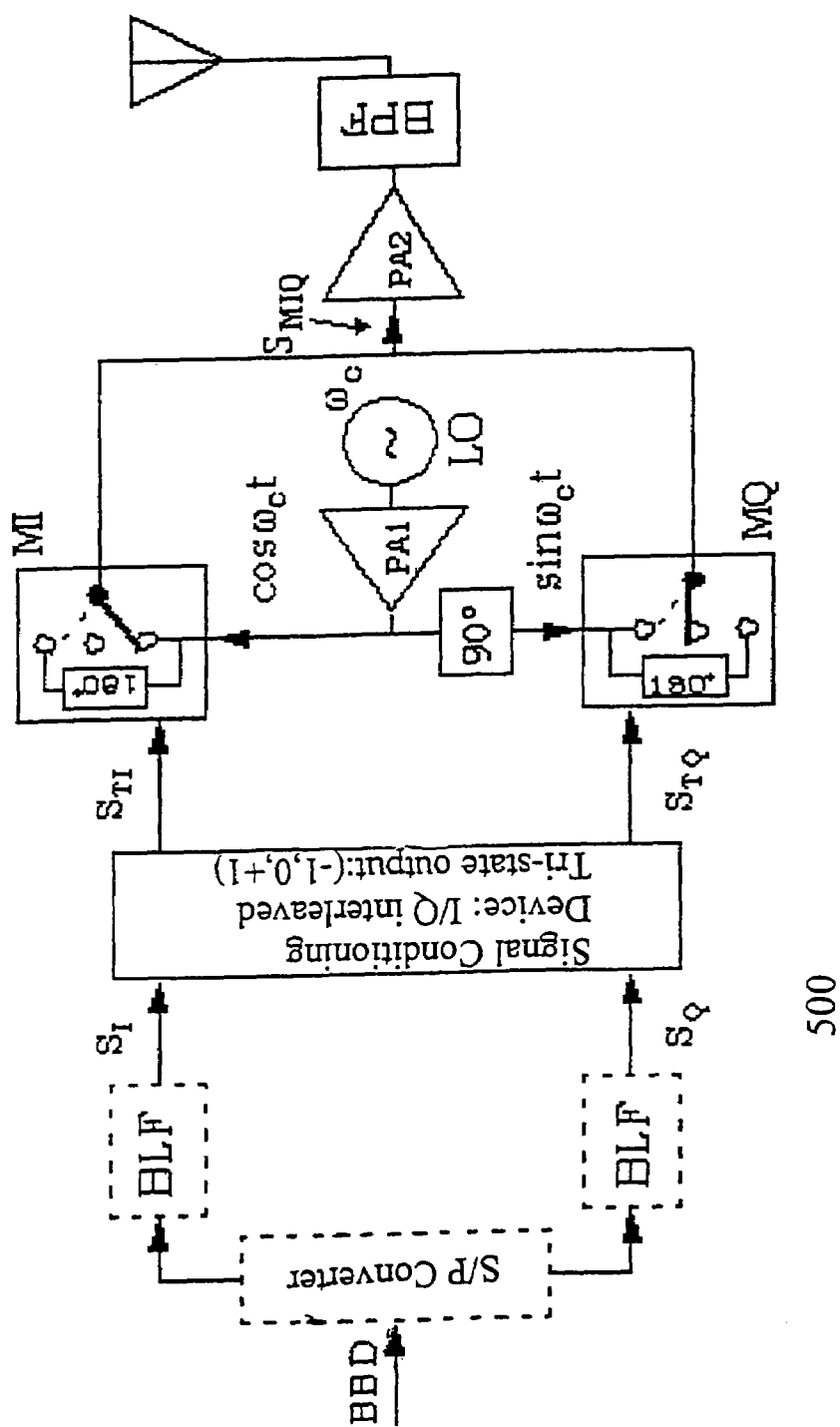
FIG. 5 depicts a scheme of a power amplification device with two switches and two NLPAS according to an example embodiment.

In FIG. 5, a second embodiment of the present invention shows a possible approach of implementing the MI and MQ multiplier devices by using tri-state switches. Here, the switching frequency for respective device MI and MQ, controlled by respective signal, $S_{TI}$ and $S_{TQ}$, is in the order of several hundreds of MHz, depending on the bandwidth of the baseband signal which is usually on the order of a few tens of MHz. At these operating frequencies, semiconductor mixers and switches are readily available. It is also shown in FIG. 5 that the amplification of the RF signals can be split between two different amplifiers PA1, PA2. This implies that the normal low-level power carrier wave, with the frequency $\omega_c$ generated by the LO first is amplified by using a high-efficient NLPA PA1. This is possible because the carrier wave ideally is an unmodulated sine wave that can be amplified by an NLPA without causing problems of generating intermodulation products. Depending on available power-handling capability of switching devices, their insertion loss, as well as other possible implementation issues, further power amplification PA2 of the $S_{MIQ}$ signal can be made just prior to the BPF as disclosed in FIG. 5.

Figure 6:
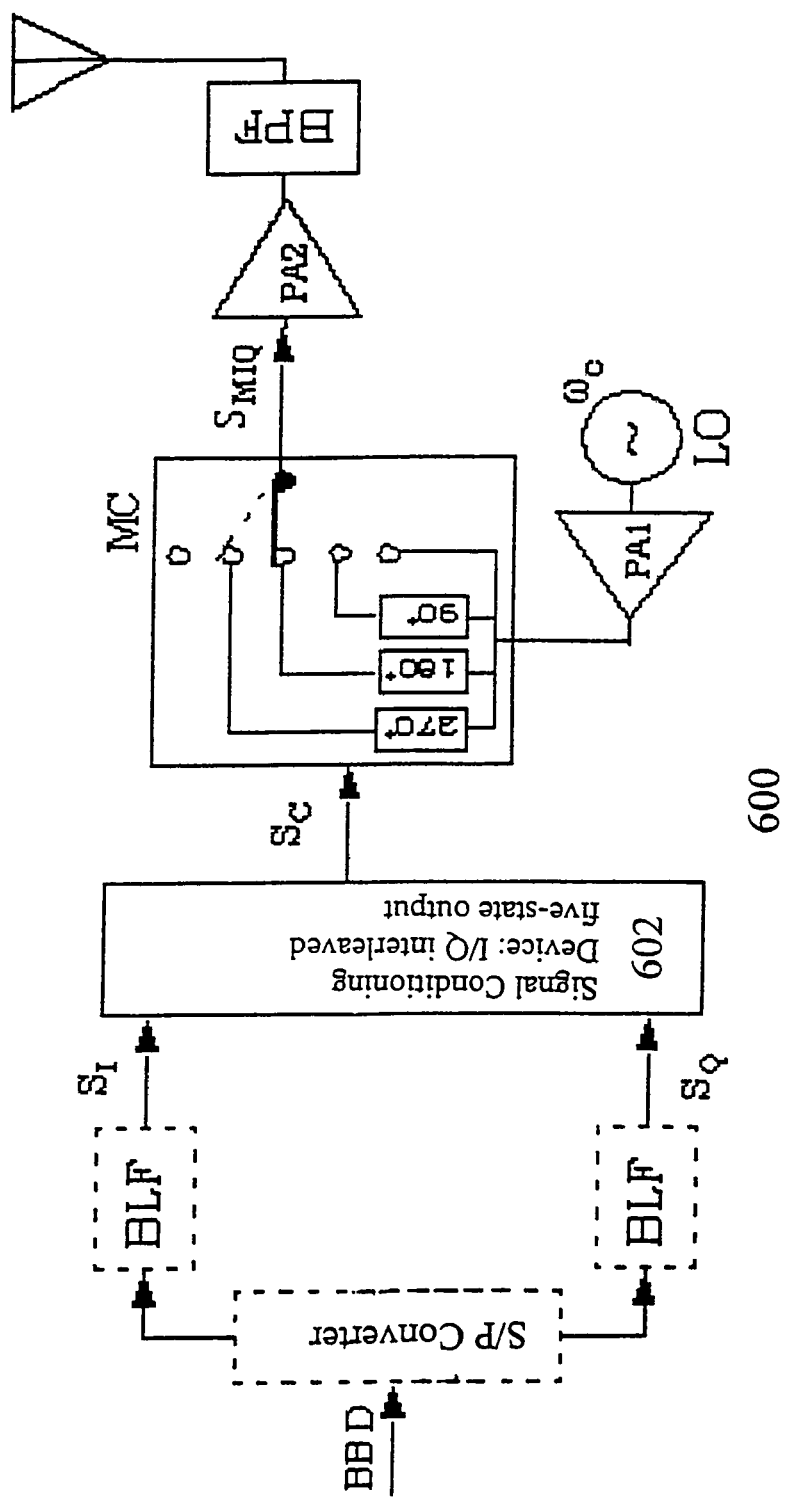
FIG. 6 depicts a scheme of a five-state controlled RF power amplification device with one switch according to an example embodiment.

Further, in an amplifier device 600 shown in FIG. 6, only one multi-throw switch MC is used to perform the required PWM of a, e.g. multiphase, signal. The number of throws in the switch is herein referred to as n. To control the switch, it is required by the SCD 602 to generate a five-state (n=5)

control signal $S_c$, (because of the five throw switch), as shown in a third embodiment of the present invention in FIG. 6. $S_c$ is a five state control line (digital signal) that controls which RF phase shift (or null signal), that is sent to the power amplifier PA2. In order to generate the control signal $S_c$, the two three-state outputs from the SCD, i.e. $S_{TI}$ and $S_{TQ}$ showed in the previous embodiments, may be passed into a signal translation unit (not shown in the drawings), with $S_c$ as the output signal. The signal translation unit has the following function:

| $S_{TI}$ | $S_{TQ}$ | $S_C$ |
|---|---|---|
| 0 | 0 | 0 degrees (MC is in the top position, see FIG. 6.) |
| 0 | −1 | 270 degrees (MC is in the second position down.) |
| −1 | 0 | 180 degrees (MC is in the third position down.) |
| 0 | +1 | 90 degrees (MC is in the fourth position down.) |
| 1 | 0 | 0 degrees (MC is in the fifth position down, i.e. bottom position.) |

Other combinations of $S_{TI}$ and $S_{TQ}$ are not possible because of the design of the SCD. It is also possible to use implementations with a greater number of amplitude and phase states, i.e n>5.

Figure 7:
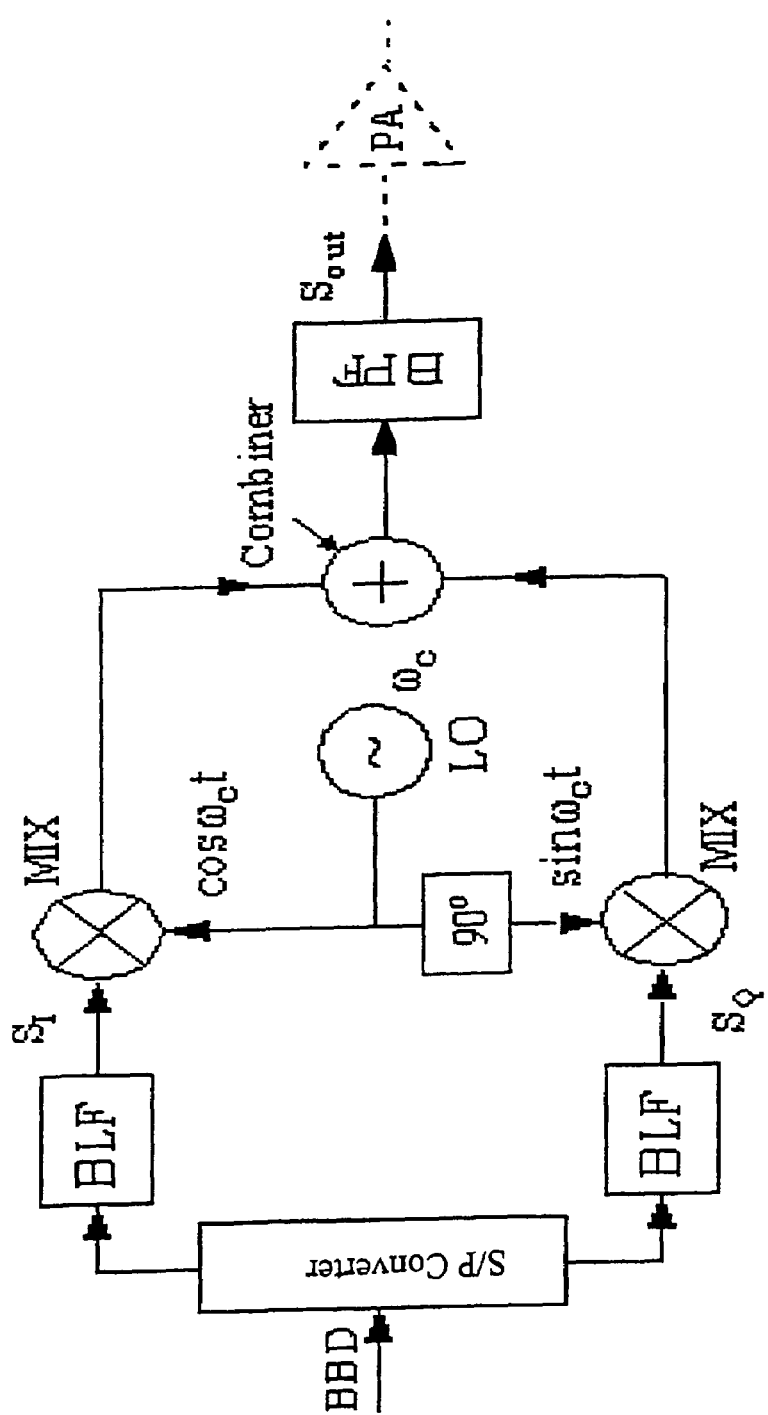
FIG. 7 depicts a conventional digital modulation scheme according to prior art.

It may be noticed that the RF signal $S_{MIQ}$, shown in FIG. 3, FIG. 5 and FIG. 6 is different from the RF signal $S_{out}$ from the conventional digital modulators as shown in FIG. 7. In general, the conventional digital modulated RF signal $S_{out}$ can be both amplitude and phase modulated with a time-varying envelope. For such a signal, it is not possible to use NLPA. This is due to undesired intermodulation products being generated by the NLPA which results in a great reduction of the quality of the output signals, which has to fulfil certain linearity requirements.

Figure 8:
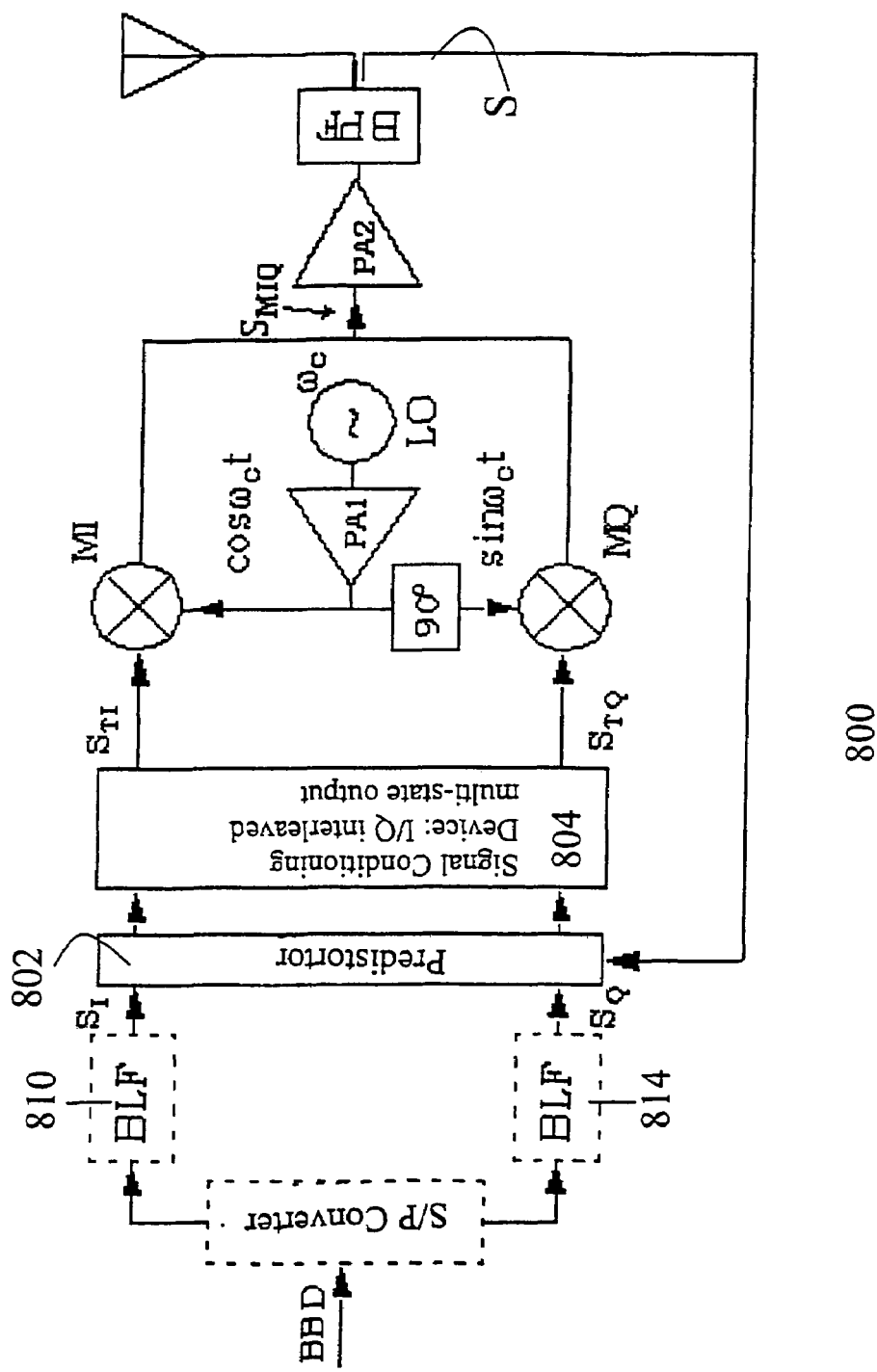
FIG. 8 depicts a scheme of a RF power amplifier comprising a predistortion unit according to an example embodiment.

Considering potential practical implementation issues, a known predistortion technique may be introduced, as shown in FIG. 8. A predistorter unit 802 is connectable to the respective BLF 810, 814 and to the SCD 804. The predistortor unit comprises two inputs for the I- and Q-signals $S_I$, $S_Q$ and one input for the amplified signal S showed in FIG. 8. I.e. the amplifier device comprises a feed-back loop from the amplified output signal to the predistortor unit 802. It further comprises two outputs for the I- and Q-signals $S_I$, $S_Q$, wherein each output is connected to the SCD 804. The predistortor unit 802 may comprise of lookup tables and other means for adjusting. The predistortor unit 802 compensates for any non-linearities and other errors that may distort the signal during the conversion and amplification process. This is to further improve the signal quality, depending on specification on the linearity of the output RF signal.

Furthermore, to improve the efficiency of the RF power amplifier, some energy recovery techniques can be applied to take care of some reflected reactive RF power from the circuits.

Signal Conditioning Device

Figure 9:
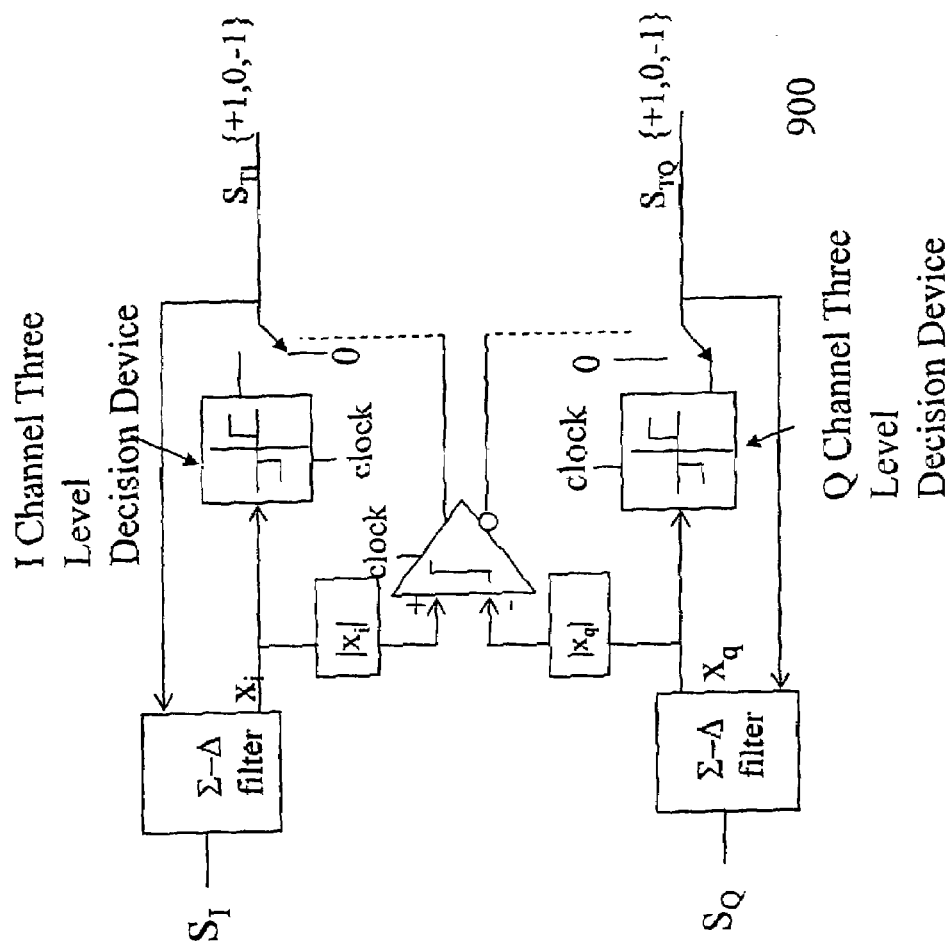
FIG. 9 discloses an circuit diagram of a possible implementation of the Signal Conditioning Device (SCD) according to an example embodiment.

In FIG. 9, an example of a possible implementation of the SCD 900 is disclosed. Sigma delta $\Sigma$-$\Delta$ encoders for the I and Q channels spectrally shape the noise away from the desired signal. The output levels of +1, 0, −1 are enabled by the three-state output from the sigma delta encoders. A controlling device is used on the output from the three level decision devices to stop simultaneous |1| outputs on the $S_{TI}$ and $S_{TQ}$ lines. The controlling device will only allow a non-zero signal on the output $S_{TI}$ line if $|x_i|$ is larger than $|x_q|$ at the decision time set by the pulse enabled by the clock. The switch positions are shown in the position where $x_q$ is larger that $x_i$, allowing output from the Q channel three level decision device on the $S_{TQ}$ line. The controlling device is embedded in the $\Sigma$-$\Delta$ feedback loops.

The classical digital modulator architecture is changed in such a way that RF power amplification can be made efficiently by use of highly efficient non-linear power amplifiers. Non-linear problems e.g., intermodulation products is eliminated or greatly reduced for complex digital modulated signals with both phase and amplitude modulations such as Wideband Code Division Multiple Access (WCDMA) and other multi-carrier signals.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A power amplifier device comprising:
   means for separating a high frequency signal having both amplitude and phase variations into an In-phase (I) component signal ($S_I$) and into a Quadrature (Q) component signal ($S_Q$);
   a Signal Conditioning Device comprising:
      means for generating an n-state level I component signal ($S_{TI}$) from said I component signal ($S_I$),
      means for generating an n-state level Q component signal ($S_{TQ}$) from said Q component signal ($S_Q$), and
      means for interleaving the n-state level I component signal and the n-state level Q component signal into, a non-overlapping in time, I component signal ($S_{TI}$) and Q component signal ($S_{TQ}$);
   a multiplexer for generating a signal ($S_{MIQ}$) with a high frequency carrier wave wherein the I and Q components are time multiplexed; and
   a single Power Amplifier for amplifying said signal ($S_{MIQ}$).

2. A power amplifier device according to claim 1, wherein the single PA is a Non-Linear Power Amplifier.

3. A power amplifier device according to claim 1, further comprising means for Pulse-Width Modulating, PWM, the I component signal ($S_{TI}$) and Q component signal ($S_{TQ}$).

4. A power amplifier device claim 1, further comprising:
   means for multiplying the I component signal ($S_{TI}$) with the I component of a high frequency carrier wave within a first multiplexing device,
   means for multiplying the Q component signal ($S_{TQ}$) with the Q component of a high frequency carrier wave within a second multiplexing device, and
   means for the I component signal ($S_{TI}$) for controlling the first multiplexing device (MI), and
   means for the Q component signal ($S_{TQ}$) for conirolling the second multiplexing device (MQ) in order to time multiplex the respective I component signal ($S_{TI}$) and Q component signal ($S_{TQ}$).

5. A power amplifier device according to claim 4, further comprising means for amplifying said carrier wave before any of the components of said carrier wave entering any of the multiplexing devices.

6. A power amplifier device according to claim 4, wherein n is equal to three and the first multiplexing device and the second multiplexing device respectively, comprise a three-throw switch.

7. A power amplifier device according to claim 1, further comprising:

means for transferring the I component signal ($S_{TI}$) and the Q component signal ($S_{TQ}$) into a translation unit, and means for transferring a control signal $S_C$ from said translation unit into an n-throw switch, means for transferring a carrier wave into said n-throw-switch and obtaining an output signal ($S_{MIQ}$) from said n-throw switch.

8. A power amplifier device according to claim 1, further comprising means for connecting a predistortor unit in order to compensate for any non-linearities and/or other errors during the amplification process.

9. A method for amplifying a high frequency signal having both amplitude and phase variations, comprising:

separating said signal into an In-phase (I) component signal ($S_I$) and into a Quadrature (Q) component signal ($S_Q$), generating an n-state level I component signal from said I component signal ($S_I$), generating an n-state level Q component signal from said Q component signal ($S_Q$), interleaving the n-state level I component signal and the n-state level Q component signal into, a non-overlapping in time, I component signal ($S_{TI}$) and Q component signal ($S_{TQ}$);

generating a signal ($S_{MIQ}$) with a high frequency carrier wave wherein the I and Q components are being time multiplexed and amplifying said signal ($S_{MIQ}$) using a single Power Amplifier, PA,.

10. A method according to claim 9, wherein the PA is a Non-Linear PA.

11. A method according to claim 9, comprising the further step of:

Pulse-Width Modulating the I component signal ($S_{TI}$), and the Q component signal ($S_{TQ}$), respectively.

12. A method according to claim 9, comprising the further steps of:

multiplying the I component signal ($S_{TI}$) with the I component of a high frequency carrier wave within a first multiplexing device, multiplying the Q component signal ($S_{TQ}$) with the Q component of a high frequency carrier wave within a second multiplexing device, and the I component signal ($S_{TI}$)

controlling the first multiplexing device and the Q component signal ($S_{TQ}$), controlling the second multiplexing device in order to time multiplex the respective I and Q component signal ($S_{TI}$, $S_{TQ}$).

13. A method according to claim 12, comprising the further step of:

amplifying said carrier wave before any of the components of said carrier wave entering any of the multiplexing devices.

14. A method according to claim 12, wherein n is equal to three and the first multiplexing device and the second multiplexing device, respectively, comprise a three-throw switch.

15. A method according to claim 9, comprising the further steps of:

transferring the I component signal ($S_{TI}$) and the Q component signal ($S_{TQ}$) into a translation unit, and transferring a control signal $S_C$ from said translation unit into an m-throw switch, transferring a carrier wave into said n-throw-switch and obtaining an output signal ($S_{MIQ}$) from said n-throw switch.

16. A method according to claim 9, further comprising:

connecting a predistortor unit in order to compensate for any non-linearities and/or other errors during the amplification process.

17. A power amplifier device according to claim 1, wherein the multiplexing device receives and uses both the I component signal ($S_{TI}$) and the Q component signal ($S_{TQ}$) for generating the signal ($S_{MIQ}$).

18. A power amplifier device according to claim 1, wherein n is an odd number of states.

* * * * *